United States Patent
Alpay et al.

(10) Patent No.: US 8,288,684 B2
(45) Date of Patent: Oct. 16, 2012

(54) LASER MICRO-MACHINING SYSTEM WITH POST-SCAN LENS DEFLECTION

(75) Inventors: Mehmet E. Alpay, Portland, OR (US);
Jeffrey Howerton, Portland, OR (US);
Patrick Leonard, Ann Arbor, MI (US);
Michael Nashner, Portland, OR (US);
David McKeever, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1111 days.

(21) Appl. No.: 12/111,616

(22) Filed: Apr. 29, 2008

(65) Prior Publication Data

US 2008/0272096 A1 Nov. 6, 2008

Related U.S. Application Data

(60) Provisional application No. 60/915,865, filed on May 3, 2007.

(51) Int. Cl.
*B23K 26/00* (2006.01)

(52) U.S. Cl. .................................................. 219/121.78

(58) Field of Classification Search . 219/121.63–121.72, 121.76, 121.78–121.8, 219/121.84; 248/466–498; 359/296.1, 223.1, 359/871, 872, 881
See application file for complete search history.

(56) References Cited

U.S. PATENT DOCUMENTS

| | | | | |
|---|---|---|---|---|
| 1,577,350 A * | 3/1926 | Otterman | .......................... | 40/649 |
| 3,005,391 A * | 10/1961 | Ragan et al. | .................. | 396/316 |
| 4,724,522 A * | 2/1988 | Belgorod | .......................... | 606/5 |
| 5,141,506 A * | 8/1992 | York | .................................. | 606/5 |
| 5,233,202 A | 8/1993 | Torii et al. | | |
| 5,430,270 A * | 7/1995 | Findlan et al. | ............ | 219/121.63 |
| 5,483,427 A * | 1/1996 | Dealey et al. | ................. | 362/485 |
| 5,690,845 A * | 11/1997 | Fuse | .......................... | 219/121.74 |
| 5,726,418 A * | 3/1998 | Duthoo | .................... | 219/121.63 |
| 6,338,560 B1 * | 1/2002 | Abedian et al. | ............... | 359/508 |
| 7,092,141 B2 * | 8/2006 | Kim et al. | ...................... | 359/290 |
| 7,244,906 B2 * | 7/2007 | Jordens et al. | ............ | 219/121.62 |
| 7,846,816 B2 * | 12/2010 | Bruel | ............................ | 438/458 |
| 2004/0165642 A1 * | 8/2004 | Lamont | ........................ | 372/107 |
| 2005/0150876 A1 | 7/2005 | Menin et al. | | |
| 2006/0131124 A1 * | 6/2006 | Chabinyc et al. | ....... | 192/105 CD |
| 2006/0211158 A1 * | 9/2006 | Arai et al. | .......................... | 438/8 |

FOREIGN PATENT DOCUMENTS

JP 2005-210103 A 8/2005

\* cited by examiner

*Primary Examiner* — Samuel M Heinrich
(74) *Attorney, Agent, or Firm* — Young Basile Hanlon & MacFarlane, PC

(57) ABSTRACT

A laser micro-machining system includes a laser source positioned to direct a laser pulse through a scan lens to a work piece mounted on a work surface and a mirror positioned between the scan lens and the work piece and tilted with respect to the work surface to reflect the laser pulse toward the work piece. The mirror can be indexed to a number of positions so that only portions of the mirror are used for a number of processing steps, extending the life of the mirror.

21 Claims, 7 Drawing Sheets

LASER MICRO-MACHINING SYSTEM WITH POST-SCAN LENS DEFLECTION

CROSS-REFERENCE TO RELATED APPLICATIONS

This application claims priority to U.S. provisional patent application No. 60/915,865, filed May 3, 2007.

TECHNICAL FIELD

The disclosure relates generally to a laser micro-machining system.

BACKGROUND

Most laser micro-machining systems utilize a fast beam steering mechanism that deflects a laser beam onto a scan lens. The scan lens in turn "translates" the input beam angle into lateral beam motion on the work surface as well as focusing the beam on the work piece. One laser micro-machining system is illustrated in FIG. 1.

In the system of FIG. 1, a beam steering mechanism 12 is followed by an f-theta (scan) lens 16 to focus a beam 14 on a scan area 18a of a work piece 18. This topology is suitable for drilling vertically-oriented holes, vias or trenches into an essentially flat work piece. As such, this topology is routinely employed in laser micro-via drilling systems to drill, for example, interconnect vias into multi-layer PCB boards, which are considered essentially flat.

BRIEF DESCRIPTION OF THE DRAWINGS

The description herein makes reference to the accompanying drawings wherein like reference numerals refer to like parts throughout the several views, and wherein.

BRIEF SUMMARY

Various embodiments of a laser micro-machining system are taught herein. According to one such laser micro-machining including a laser source positioned to direct a laser pulse through a scan lens to a work piece mounted on a work surface, an improvement comprises a mirror positioned between the scan lens and the work piece and tilted with respect to the work surface to reflect the laser pulse toward the work piece. This embodiment and others are explained in additional detail hereinafter.

DETAILED DESCRIPTION

Figure 1:
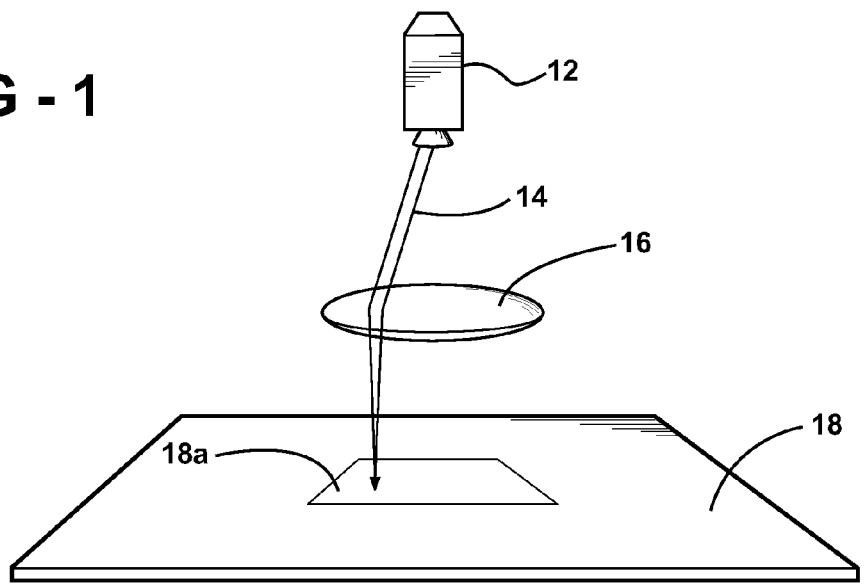
FIG. 1 is a schematic representation of a standard configuration for a laser micro-machining system.

In the topology of FIG. 1 described previously, the focused beam 14 hits the work surface nominally at a 90-degree angle. Such an arrangement is suitable for drilling into essentially flat work pieces as shown, but it is not flexible enough to deal with other geometries. In contrast, embodiments of the invention provide an improved laser micro-machining system with one or more tilt mirrors located between the scan lens and the work piece that allows a modified system angle of attack. Embodiments of the invention are explained with reference to FIGS. 2-11.

Figure 2:
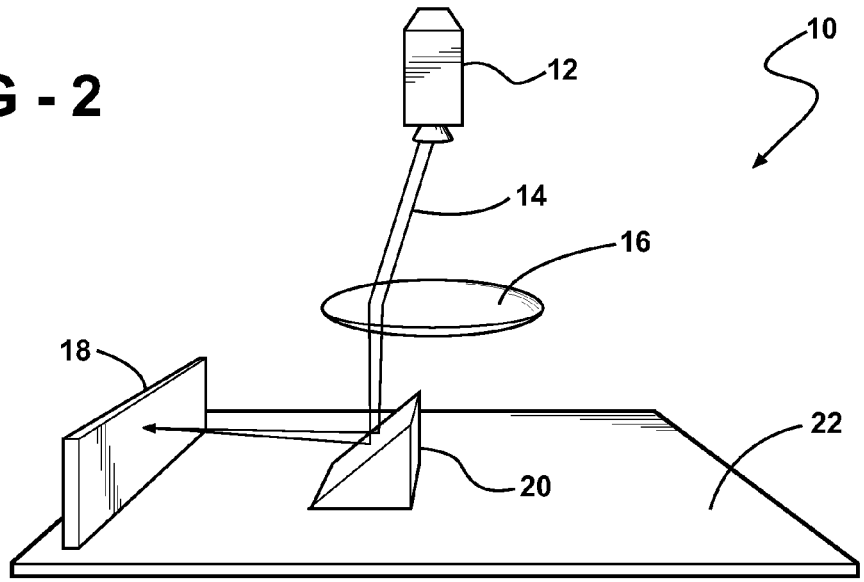
FIG. 2 is a schematic representation of an improved laser micro-machining system with a tilt mirror where the angle of attack can be changed within a certain work zone via a fixed tilt-mirror attached to the part carrier.

One embodiment of this invention includes a laser micro-machining system 10 with at least one tilt mirror affixed to the part carrier. Such a system is shown in FIG. 2. This system 10 comprises a fast beam steering module 12. Module 12 can be piezo- or voice coil-actuated tip-tilt mirrors or a pair of galvanometers for rapid scanning of a laser pulse or beam 14 across a scan lens 16. Scan lens 16 can be an f-theta scan lens or any scan lens known to those knowledgeable in the art. In the system of FIG. 1, scan lens 16 would translate beam 14 angle directly onto a work piece 18. In the improved laser micro-machining system 10 described initially with respect to FIG. 2, scan lens 16 instead directs beam 14 onto a post-scan lens mirror, hereinafter a tilt mirror 20, affixed on part carrier 22. Tilt mirror 20 in turn deflects the beam path in a generally lateral direction onto work piece 18. Tilt mirror 20 may be fixed at any angle of deflection, but in the embodiment shown in FIG. 2 the angle is 45 degrees. This allows a beam 14 that originates from above to direct onto a work piece 18 from a horizontal direction, which in turn allows the drilling of horizontally-oriented vias or trenches without having to rotate the work piece 18 or all the optical elements.

While fixed tilt mirror 20 has the advantage that it can allow this horizontally-oriented drilling in contrast to the topology of FIG. 1, the work zone on the work piece 18, that is, the area of drilling, is limited by the mounting location and surface area of fixed tilt mirror 20. If other angles and/or work zones are required, either multiple fixed tilt mirrors 20 can be implemented by mounting them on the same carrier 22, or one such mirror 20 can be replaced with another by the use of more than one carrier or scan lens assembly.

Alternatively, one or more tilt mirrors 20 could be mounted on motion stages, which are in turn movably mounted to part carrier 22. Actuation of such stages can be achieved manually or through servo motors, piezo-actuators, and the like. Tilt mirror(s) 20 mounted on such stages can be moved along and/or rotated about one or more axes of motion to change the angle of attack and/or work zone associated with each tilt mirror 20. Two examples of this mounting are shown by example in FIGS. 3 and 4.

Figure 3:
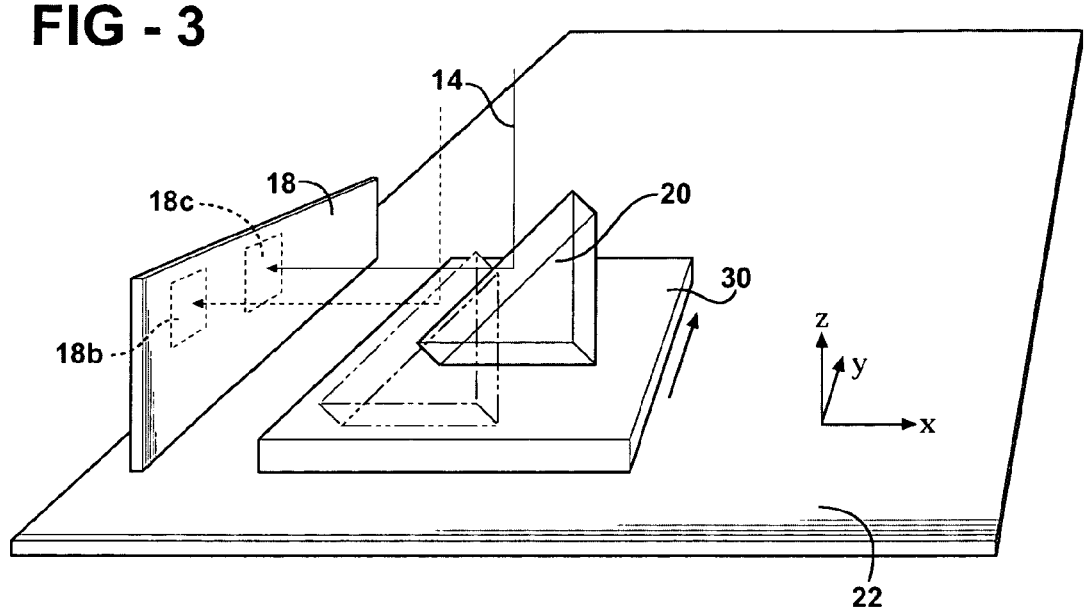
FIG. 3 is a simplified schematic representation of an improved laser micro-machining system with a tilt-mirror mounted for movement along a y-axis.

FIG. 3 omits module 12 and scan lens 16 for clarity. In FIG. 3, tilt mirror 20 is mounted on a linear stage 30 movable with respect to work piece 18. In this example, work piece 18 is mounted in a fixed position on the part carrier 22, and linear stage 30 is movably mounted on part carrier 22. Linear stage 30 is mounted so as to move the tilt mirror 20 laterally along the y-axis, and beam 14 is directed to the new position of tilt mirror 20 by module 12 according to known control methods. As shown, linear stage 30 moves from a first position such that beam 14 is directed to work zone 18a from tilt mirror 20 (shown in dashed lines) to a second position such that beam 14 is directed to work zone 18b from tilt mirror 20 (shown in solid lines). Accordingly, lateral motion along the y-axis by linear stage 30 provides the ability to shift the work zone associated with tilt mirror 20 along the y-axis. The user could move linear stage 30 to make greater or lesser adjustments as desired.

Figure 4:
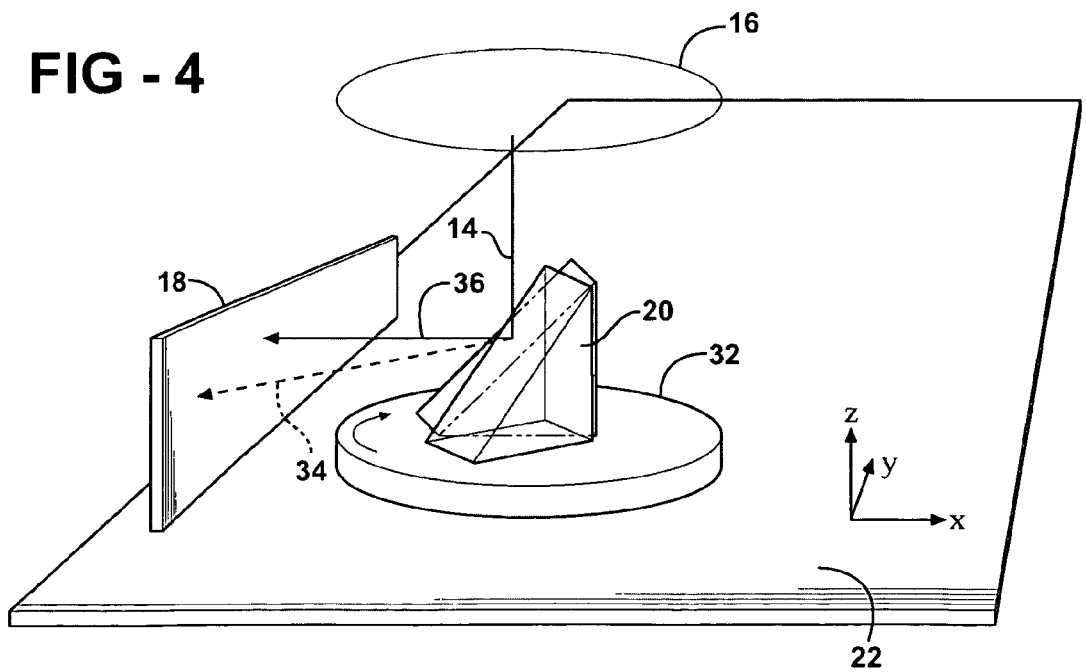
FIG. 4 is a simplified schematic representation of an improved laser micro-machining system with a tilt-mirror mounted for movement about a z-axis.

In FIG. 4, tilt mirror 20 is mounted on a rotary stage 32, which is in turn mounted on part carrier 22 for rotary motion therewith. More specifically, rotary stage 32 is mounted for rotation about the scan lens optical axis, or z-axis (yaw) to provide the ability to change the angle of attack on the work piece 18. For example, when rotary stage 32 is in a first position such that tilt mirror 20 is in a first position as shown by the dashed lines, tilt mirror 20 directs the beam path in a direction shown by first beam path 34. When rotary stage 32 rotates in the direction indicated by the arrow such that tilt mirror 20 is in a second position as shown by the solid lines, tilt mirror 20 directs the beam path in a direction shown by second beam path 36. The user could move rotary stage 32 to make greater or lesser adjustments as desired.

FIGS. 3 and 4 are merely illustrations of two possible arrangements allowing movement of the tilt mirror 20 with respect to the work piece 18. For example, these arrangements show the tilt mirror 20 movably mounted on the part carrier 22. However, the tilt mirror 20 could be mounted on motion stages adjacent the part carrier 22. Many other arrangements for obtaining the desired benefits are possible to one skilled in the art provided with the teachings herein.

Another embodiment of the invention includes one or more tilt mirrors 40 affixed to a scan lens assembly, which comprises module 12 and scan lens 16, along with control for module 12. One such arrangement is shown by example in FIG. 5.

Figure 5:
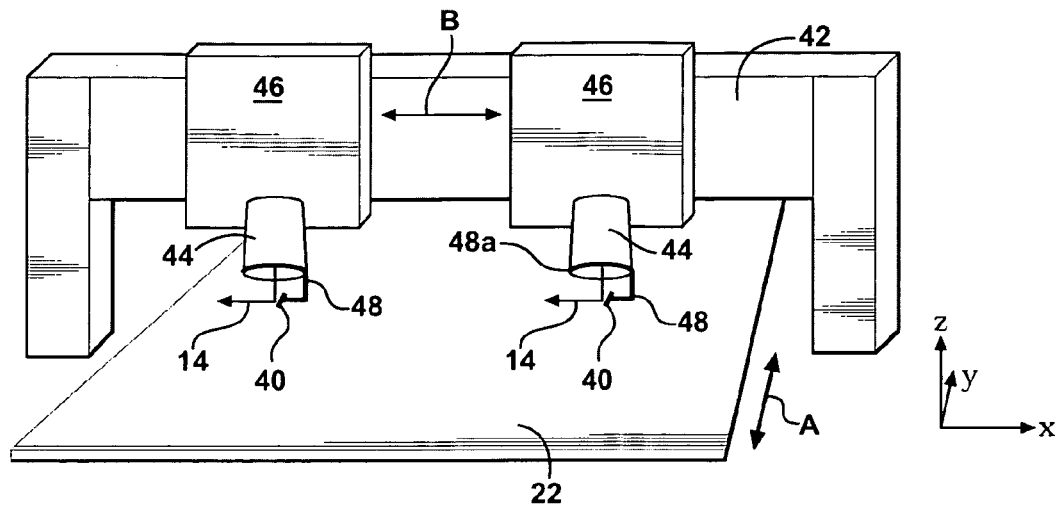
FIG. 5 is a schematic representation of an improved laser micro-machining system with a tilt-mirror mounted for movement with the scan lens assembly.

In FIG. 5, part carrier 22 defines a y-stage moving along the y-axis as shown by arrow A. Although work piece 18 is not shown in FIG. 5, work piece 18 moves with part carrier 22. Part carrier 22 moves relative to a cross beam 42 supporting scan lens assembly 44. In this embodiment, scan lens assembly 44 is fixedly mounted to a movable support 46 mounted on cross beam 42. Movable support 46 defines a x-stage moving along the x-axis as shown by arrow B. Details of the mounting and methods for moving movable support 46 are not described in detail because such details are known in the art.

Tilt mirror 40 is fixedly mounted to scan lens assembly 44 using a mounting fixture 48. Mounting fixture 48 can be fixed to scan lens assembly 44 by welding, screws, etc. As shown, mounting fixture 48 includes a band or hose clamp 48a surrounding and removably fixed to scan lens assembly 44. Regardless of how mounting fixture 48 is attached to scan lens assembly 44, mounting fixture 48 includes a generally L-shaped extension between scan lens assembly 44 and part carrier 22 to support tilt mirror 40 in a position substantially located along the scan lens optical axis.

As can be seen, the main difference between this approach and that shown with respect to FIGS. 2-4 is that the work zones and angles of attacks associated with tilt mirror 40 are available at all times as part carrier 22 and scan lens 16 move with respect to one another. Although FIG. 5 is illustrated with a tilt mirror 40 fixed with respect to scan lens assembly 44, tilt mirror 40 could be replaced with a mirror movable by lateral translation along one or more axes, or rotation about one or more axes, or a combination thereof.

Figure 6:
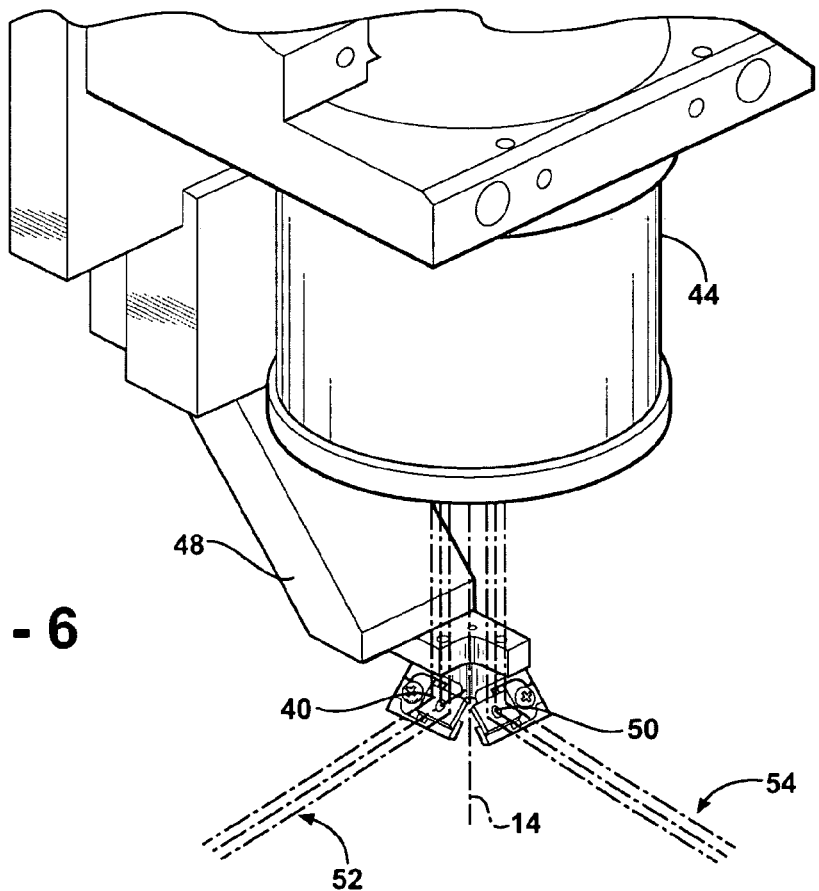
FIG. 6 is a schematic representation of an improved laser micro-machining system with two tilt-mirrors mounted for movement with the scan lens assembly.

Another embodiment involves arranging the tilt mirror(s) in such a way as to allow for the laser beam 14 to get past the tilt mirrors without being deflected by any of them within a sub-range of the scan area of the beam steering module 12. Such an arrangement is illustrated in FIG. 6 with a first tilt mirror 40 and a second tilt mirror 50. In a similar manner to the embodiment shown in FIG. 5, first tilt mirror 40 is fixedly mounted to scan lens assembly 44 by mounting fixture 48. In this example, mounting fixture 48 supports second tilt mirror 50 at a right angle to first tilt mirror 40. Mounting fixture 48 and first and second tilt mirrors 40, 50 form a central gap along the scan lens optical axis. This arrangement retains the different angles of attack provided by the tilt mirrors 40, 50 and represented by respective beam paths 52, 54, while also providing the system with the ability to drill holes and/or cut trenches as a "standard" system with the beam 14 pointing straight down through the gap.

The ability to provide a path for beam 14 such that it can get past tilt mirrors 40, 50 affixed to scan lens assembly 44 without being deflected makes it possible to create arrangements that combine tilt mirrors 40, 50 affixed to scan lens assembly 44 and one or more tilt mirrors 20 affixed to part carrier 22. Tilt mirror(s) 20 affixed to part carrier 22 are utilized by positioning the scan lens 16 over such mirrors and steering beam 14 past tilt mirrors 40, 50 affixed to scan lens assembly 44 via beam steering module 12. Although two tilt mirrors 40, 50 are shown in FIG. 6, this is merely an example. One tilt mirror or more than two can be mounted with scan lens assembly 44.

Embodiments described thus far provide a micro-machining system with the flexibility to be used in a number of applications. One issue that arises in this configuration is that the mirrors 20, 40, 50 are subject to contamination, a major cause of performance degradation, due to their close association with a drilled work piece. This contamination can result in frequent and costly part replacements. Contamination of planar imaging surfaces has previously been addressed by, for example, the inclusion of a debris removal system. Such a setup attempts to remove the debris generated by the machining process before it has a chance to reach the mirrors and contaminate them. Also, air knives have been employed to adjust air flow so as to "shield" the mirror from debris that might otherwise land on the mirror and contaminate the reflective surface. Less common due to expense and difficulting in implementation, sealed compartments can be used for at least portions of the optical components in an attempt to keep contaminants out. These methods are preventative, in that they are designed in an attempt to keep mirrors from getting contaminated in the first place or, failing that, delaying contamination build-up as long as possible. Once the mirror does get contaminated, these approaches offer no recourse other than replacing the mirror.

Accordingly, another embodiment of the invention limits contamination of the mirror surface and the subsequent degradation in performance that results in frequent and costly part replacements. If a mirror surface is substantially larger than the diameter of the incident laser pulse or beam path 14, the mirror is slightly moved so that a clean uncontaminated portion of the mirror surface is presented to the incident beam. Such moves are called "indexing moves."

The number of indexing moves that can be accommodated by a given mirror depends on the size of the mirror, the incident beam diameter and the scan area on the mirror surface utilized by beam steering module 12. In a typical application it is not uncommon to use mirrors that are 25 mm×40 mm subject to an incident beam that is only 2-3 mm in diameter. The scan area on the mirror surface can be limited by system control software that controls beam steering module 12. Consequently, a significant number of indexing moves are possible, which might easily increase the effective lifetime of the mirror by an order of magnitude before the entire mirror surface is exhausted, requiring replacement of the part.

Figure 7:
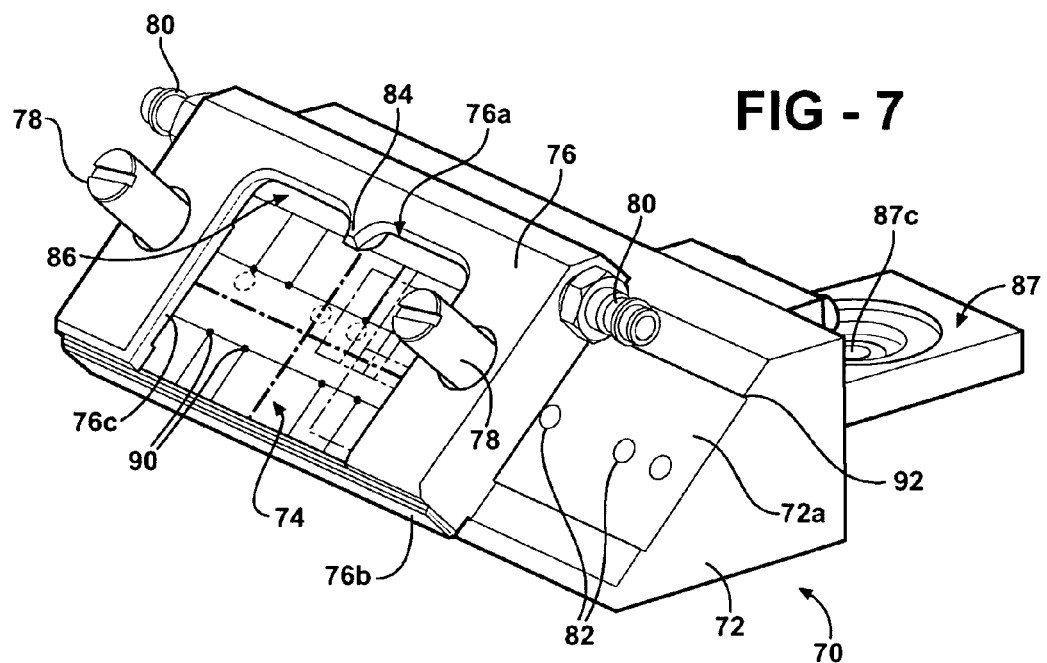
FIG. 7 is a schematic representation of a mirror and mount with integrated indexing capability.
Figure 8:
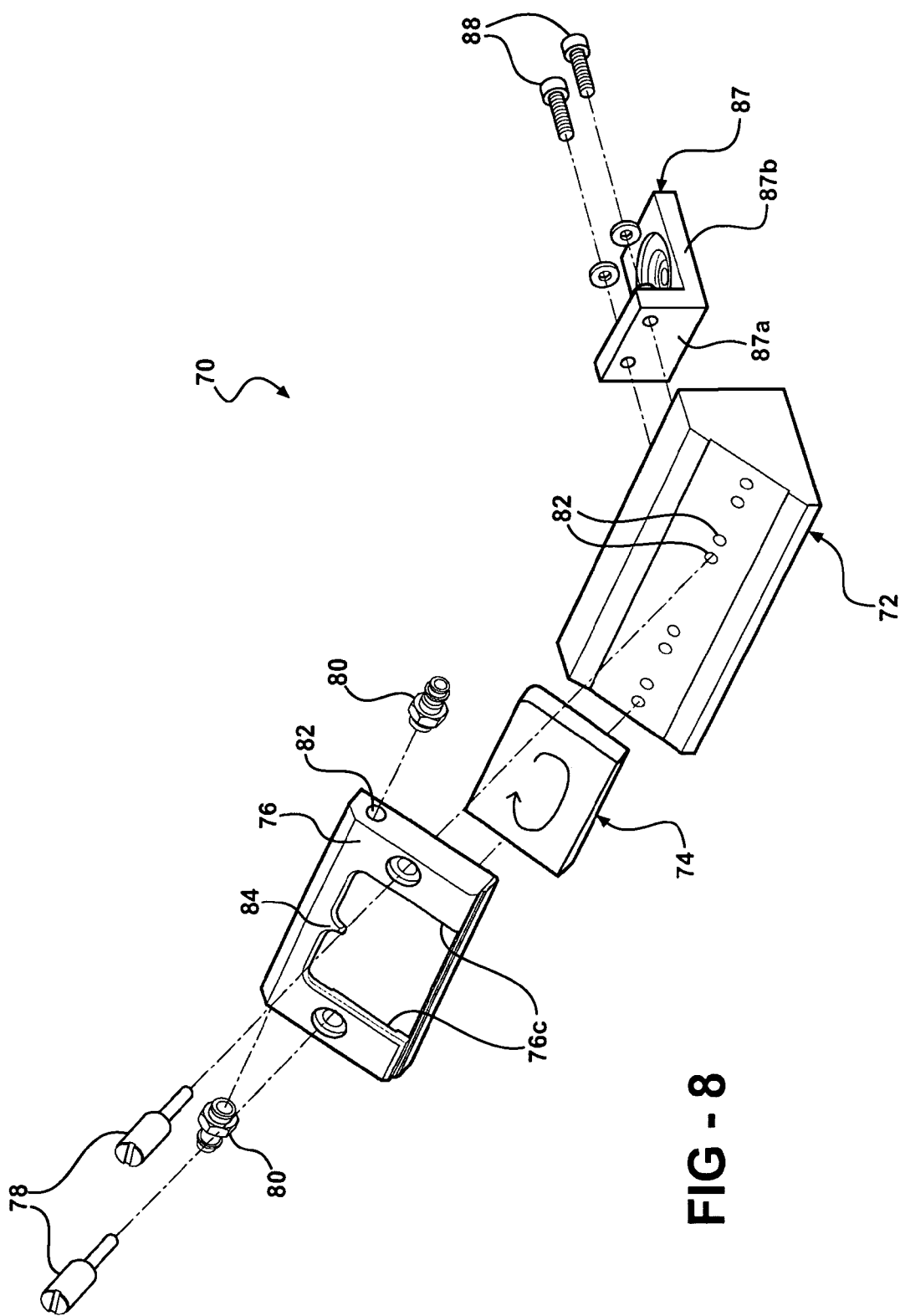
FIG. 8 is an exploded view of the mirror and mount shown in FIG. 7.

A mirror mount 70 explicitly designed with indexing capability in mind is illustrated in FIGS. 7 and 8. Mirror mount 70 includes a mounting base 72 supporting a mirror 74 captured by a bracket 76. More specifically, bracket 76 includes a cavity facing mounting base 72 and sized to surround and fixedly support mirror 74 in contact with mounting base 72 when bracket 76 is fixed to mounting base 72 with indexing screws 78. Indexing screws 78 fix bracket 76 to mounting base 72 using indexing holes 82 bored into a facing surface 72*a* of mounting base 72. As can be seen, facing surface 72*a* of mounting base 72 forms a 45 degree angle with the horizontal, but this angle is by example only.

Bracket 76 includes a top edge 76*a*, a bottom edge 76*b* and two opposing side edges 76*c* forming an aperture. Two opposing side edges 76*c* comprise respective extension portions that extend in the direction towards mirror 74 for a distance greater than top edge 76*a*. When mounted to mounting base 72, opposing side edges 76*c* of bracket 76 press against mirror 74, and bottom edge 76*b* covers an exposed bottom edge of mirror 74. Preferably, but not necessarily, bottom edge 76 only just covers the exposed bottom edge of mirror 74 and does not extend beyond the externally-facing surface of mirror 74 for reasons described in additional detail hereinafter.

Due to the inclusion of extended opposing side edges 76*c*, top edge 76*a* of bracket 76 is spaced-apart from the externally-facing surface of mirror 74 to form one or more air slots. For example, in FIGS. 7 and 8, a central extension 84 is formed in the midpoint of top edge 76*a* and extends towards bottom edge 76*b* for a short distance. Accordingly, two air slots 86 are formed in this embodiment. Air slots 86 are in communication with air transmitted from external of bracket 76 through air inlets 80 mounted in holes 82 bored in opposing sides of bracket 76. During operation, air is provided to air inlets 80 through air hoses coupled thereto such that an air curtain substantially tangential to the air flow from air inlets 80 is formed and blows down particles coming towards mirror 74.

More specifically, drilling of the work piece results in the formation of debris projecting in a number of directions, including back to mirror 74 in mirror mount 70. As a result, mirror 74 is subject to significant amounts of contamination from the ejecta generated during this part processing. In this embodiment, air provided through air inlets 80 is directed through slots 86 so as to blow such debris along the surface of mirror 74 towards the bottom of mounting base 72, which is mounted as discussed hereinafter. Debris is prevented from coming between mirror 74 and mounting base 72 by bottom edge 76*b* of bracket 76, and, since bottom edge 76*b* of bracket 76 preferably does not extend beyond the surface of mirror 74, the debris has a clear path off the surface of the mirror 76. Central extension 84 helps to direct the air to target zones as discussed hereinafter. The air curtain flowing across mirror 74 surface can also be called a laminar air flow.

Mounting base 72 is removably fixed to a mounting bracket 87. Mounting bracket 87 is L-shaped having a first mounting surface 87*a* in contact with a surface of mounting base 72 opposing mirror 74. First mounting surface 87*a* includes holes through which bolts 88 are inserted to attach mounting base 72 to mounting bracket 87. Less preferably, mounting base 72 is permanently fixed, such as by welding, to mounting bracket 87. Mounting bracket 87 also includes a second mounting surface 87*b* that is, in turn, removably fixed to part carrier 22 as shown in FIG. 2, to a motion stage such as linear stage 30 or rotary stage 32 as shown in FIGS. 3 and 4, respectively, or to mounting fixture 48 as shown in FIGS. 5 and 6. Mounting bracket 87 could be fixed as described using a bolt through a mounting hole 87*c* through second mounting surface 87*b*, for example.

Alternatively, mounting bracket 87 could be mounted so that the mounting base 72 is rotatable about an axis extending through mounting hole 87*c* such as through a connection to a servo motor, which is in turn fixed to part carrier 22, stage 30 or 32, or mounting bracket 87.

In the embodiment shown in FIGS. 7 and 8, there are eight index positions 90 on mirror 74 corresponding to eight different positions offset from a center of mirror 74. That is, the eight intersections of the solid lines show where beam 14 hits the mirror surface at eight index positions 90 when beam steering module 12 is at a zero (detent) position.

By successively using these eight index positions 90, the effective mirror lifetime is significantly increased. These eight index positions 90 are set so that incident beam 14 is offset from the central mirror axis. As shown in FIG. 7, bracket 76 is mounted in one of four positions using indexing holes 82. More specifically, bracket 76 in FIG. 7 is shown in the left-most, or first position, where indexing screws 78 are fixed to the left-most, spaced indexing holes 82. Accordingly, beam 14 would hit the top 1st indexing position 90. Each of three additional positions in the top row of indexing positions 90 is achieved by unscrewing indexing screws 78, shifting bracket 76 and mirror 74 against facing surface 72*a* of mounting base 72 rightward to the next set of spaced indexing holes 82, and screwing indexing screws 78 into those indexing holes 82. Accordingly, after the four index positions 90 closer to top edge 76*a* are exhausted through the shift across the four positions (due to contamination), mirror 74 can be rotated 180 degrees in the direction of the arrow in FIG. 8 and be re-inserted in bracket 76 on mounting base 72 so as to move between the same four positions to provide another four index positions 90. As shown, mirror mount 70 provides a slidable adjustment that is manually accomplished. Optionally, and as shown in FIG. 7, bracket 76 is movable between the plurality of positions on a track 92.

The dashed lines in FIG. 7 indicate scan areas of the beam 14 centered about different index positions 90. For illustrative purposes, scan areas associated with top 3th, top 4th and bottom 4th index positions 90 are shown. Note that the scan areas slightly overlap, which enables more index positions 90 on mirror 74, hence enabling longer life of mirror 74.

Figure 9:
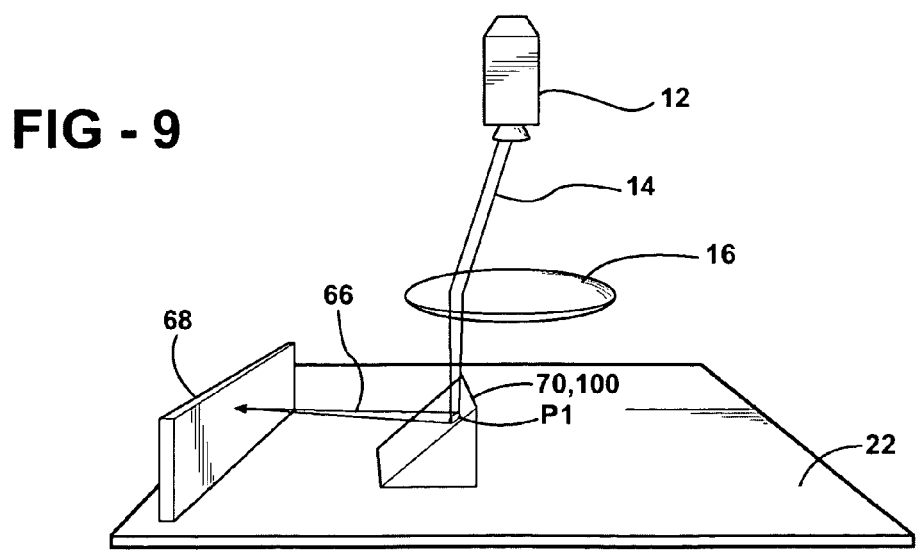
FIG. 9 is a schematic representation of a laser micro-machining system with an indexible mirror with a fixed angle of attack before the indexible mirror is indexed.
Figure 10:
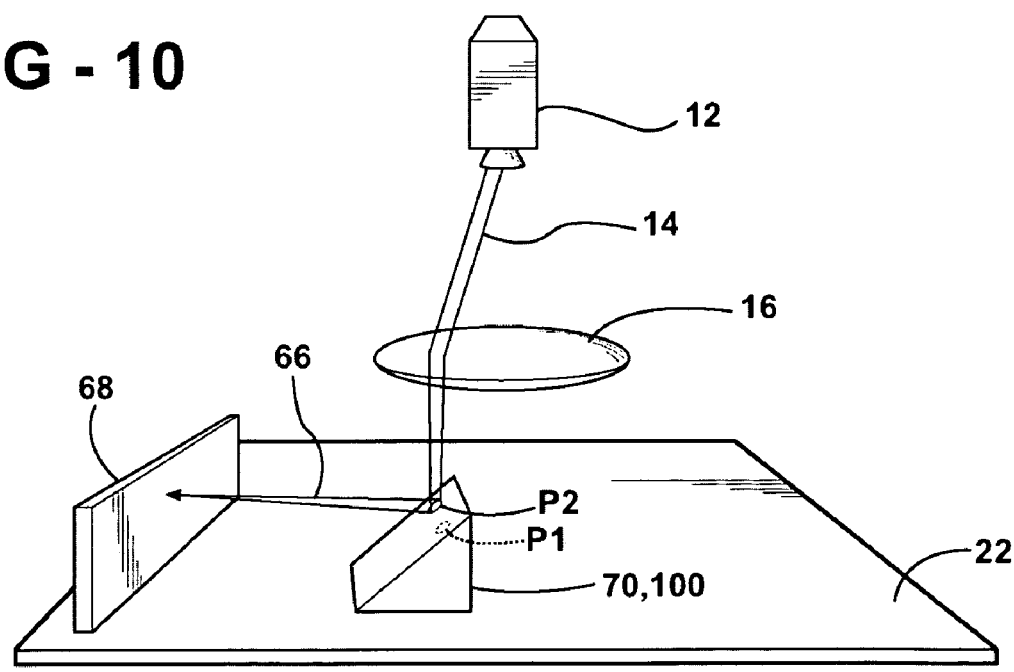
FIG. 10 is a schematic representation of the laser micro-machining system according to FIG. 9 after the indexible mirror is indexed.

Indexible mirror 74 as described in FIGS. 7 and 8 can be implemented in any of the arrangements shown and described with reference to FIGS. 2-6. For example, indexible mirror 74 on mirror mount 70 can be mounted as shown in the micromachining system of the simplified schematic of FIGS. 9 and 10, which is similar to that shown in FIG. 2. As shown in FIG. 9, fast beam steering module 12 deflects beam 14 onto scan lens 16, which in turn directs beam 14 to an index position 90, here P1, on indexible mirror 74. Based on its mounting in mirror mount 70, indexible mirror 74 deflects beam 66 laterally onto a work piece 68. The system may optionally measure the strength of beam 66 by sensing the portion of the beam that is transmitted through mirror 74 using, for example, a photo detector placed behind mirror 74. When the strength drops below a threshold, the system can notify the operator that the index position P1 is contaminated. In FIG. 10, indexible mirror 74 has been adjusted horizontally through either manual or automatic means so that scan lens 16 directs beam 66 to a clean, uncontaminated index position, here labeled P2. This process repeats until there are no longer any clean uncontaminated portions on the top edge of mirror 74, and mirror 74 is rotated so that the bottom index positions 90 are along top edge 76a for use in subsequent processing steps.

Figure 11:
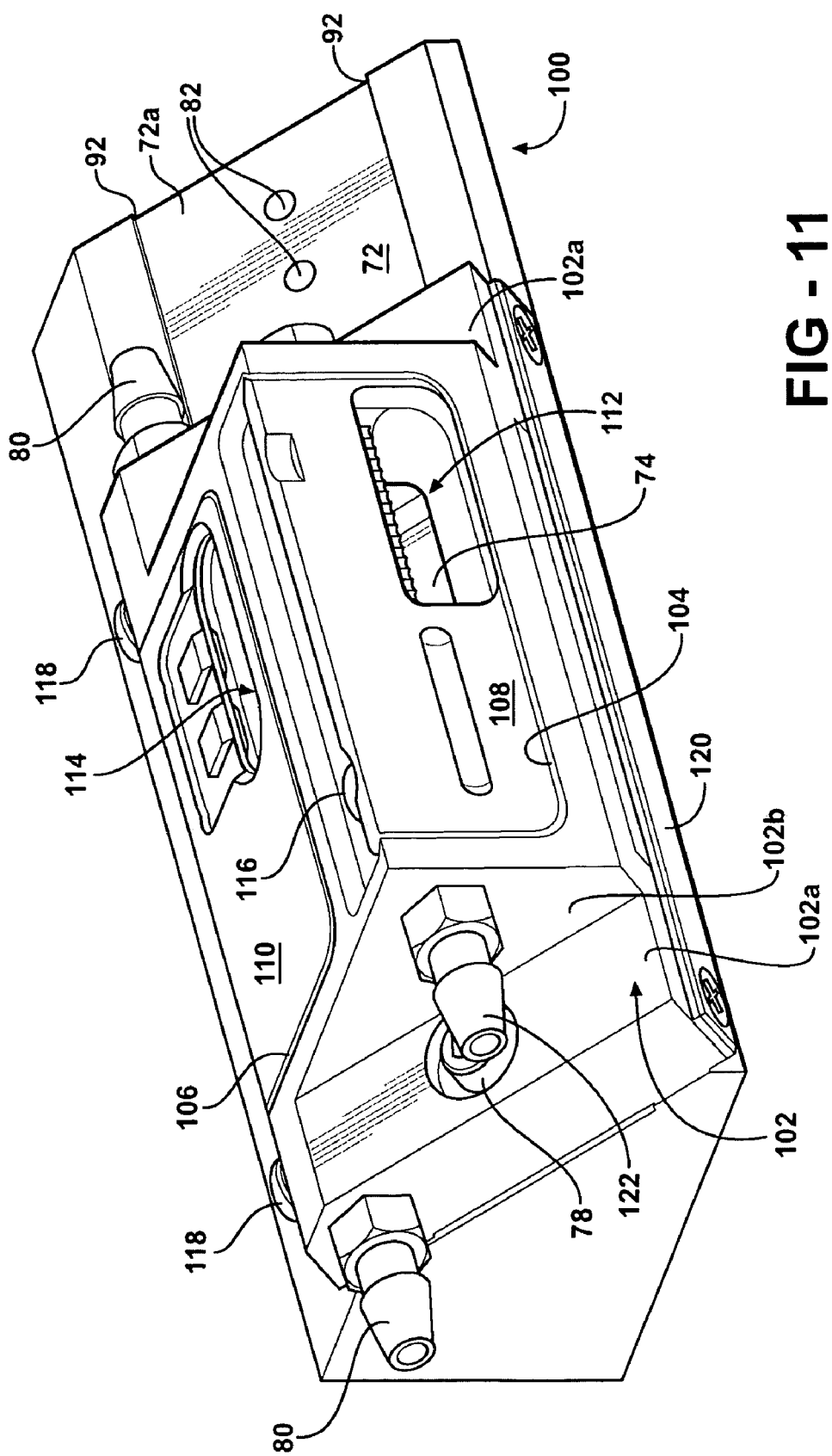
FIG. 11 is a schematic representation of another embodiment of a mirror and mount with integrated indexing capability.

Debris accumulation is particularly problematic in the area where beam 14 contacts the surface of mirror 74. For this reason, central extension 84 desirably aids in directly the air flow from air inlets 80 out air slots 86 towards to index positions 90. Clean dry air (CDA) can flow into air inlets 80 at a flow rate of 10 cfm, for example. Moreover, air flow can occur in a number of directions based on the shape and structure of the top edge 76a, and the invention is not limited to the disclosed arrangement. Another option to minimize debris accumulation is to enclose mirror 74 with the provision of slits for incoming beam 14 and reflected beam 66 such that mirror 74 is in a pressurized chamber. Such an alternative embodiment is shown in FIG. 11. FIG. 11 includes many of the same features as FIGS. 7 and 8, so only the differences are described hereinafter.

In FIG. 11, a mirror mount 100 includes a bracket 102 mounted on mounting base 72. In a similar manner to bracket 76, bracket 102 includes a cavity facing mounting base 72 and sized to surround and fixedly support mirror 74 in contact with mounting base 72 when bracket 102 is fixed to mounting base 72 with indexing screws 78. Facing surface 72a of mounting base 72, and hence mirror 74, forms a 45 degree angle with the horizontal, but this angle is by example only. Indexing screws 78 are affixed in through-holes extending through opposing outer surface portions 102a of bracket 102. Opposing outer surface portions 102a thus similarly form a 45 degree angle with the horizontal and are called tilted portions 102a hereinafter. Air inlets 80 are also mounted in tilted portions 102a.

Extending to form a right angle with tilted portions 102a and covering mirror 74 and the aperture of bracket 102 is an integral extended surface portion 102b, also called a housing portion 102b hereinafter. Housing portion 102b includes two U-shaped apertures 104, 106 in respective surfaces. Aperture 104 is said to be in the "front" of the housing portion 102b, while aperture 106 is said to be on the "top" of the housing portion 102b. Each of U-shaped apertures 104, 106 includes a respective groove into which respective windows 108, 110 slidingly mate.

Window 108 slides into and out of the groove in U-shaped aperture 104 from the top of housing portion 102b and is secured in U-shaped aperture 104 by a screw 116 affixed in a securing hole in housing portion 102b and in pressing contact with one of two indentations 117 in a top edge of window 108. Window 110 slides into and out of the groove in U-shaped aperture 106 from the rear of housing portion 102b. Window 110 is secured in U-shaped aperture 106 by a flat securing portion (similar to flat cover piece 120 described hereinafter) secured to an upper side of the tilted portions 102a on either side of the housing portion 102b with securing screws 118.

Window 108 contains a slit 112, and window 110 contains a slit 114. Slits 112, 114 are aligned in operation so beam 14 proceeds through slit 114 and reflects through slit 112 as, for example, beam 66.

In this embodiment, bracket 102 does not have an integrated bottom edge supporting mirror 74 and keeping debris from accumulating between mirror 74 and mounting base 72. Instead, a flat cover piece 120 extends from a left side of bracket 102 to the right side (that is, between opposing tilted portions 102a) to engage with the bottom edge of mirror 74. This flat cover piece 120 is removably screwed into apertures (not shown) in bottom surfaces of tilted portions 102a to provide easier replacement of mirror 74. As can be seen, housing portion 102b has an opening on its bottom edge in between opposing tilted portions 102a. Like the integral bottom edge 76b of bracket 76, flat cover piece 120 is preferably flush with or slightly below the externally-facing surface of mirror 74. These two features facilitate removal of debris from mirror 72.

At least one additional air inlet 122 is provided to supply pressurized air into the chamber defined by the externally-facing surface of mirror 74 and the interior of housing portion 102b as partially enclosed by windows 108, 110. CDA flowing into air inlets 80 can also flow into air inlet 122. This flow can occur at a same flow rate of 10 cfm, for example, or air flowing into air inlets 80 can occur at a different (for example, a higher) rate than the air flowing into air inlet 122. This creates a pressurized chamber that minimizes particles reaching mirror 74. Preferably, the pressure therein is slightly greater than atmospheric pressure. For those particles that do reach mirror 74, they are removed by the laminar air flow described previously.

Mirror mount 100 of FIG. 11 can be fixedly or movably mounted as previously described with respect to mirror mount 70.

In operation, bracket 102 moves with respect to mounting base 72 as previously described with respect to the movement of bracket 76 with respect to mounting base 72 to a variety of indexing positions 90 of mirror 74. Slits 112, 114 can extend the entire length of windows 108, 110, but preferably they are smaller to minimize the exposed area. As bracket 102 moves across surface 72a of mounting base 72, slits 112, 114 need to align with the beams 14, 66. This alignment, coupled with the desire for a small slit size, could be accomplished by removing screw 116 and window 108 and replacing it in U-shaped aperture 104 with a window having a slit with a different orientation and/or location that slit 112 and loosening or removing screws 118 and their secured flat securing portion in order to remove and replace window 110 in U-shaped aperture 106 with a window having a slit corresponding to the new window in U-shaped aperture 104. In the illustrated example of FIG. 11, slits 112, 114 extend for approximately half the length of windows 108, 110, and four sets of indexing holes 82 provide four positions for bracket 102 that, together with the rotation of mirror 72, define eight indexing positions 90 as described previously with respect to bracket 70. As shown, bracket is in the first, left-most set of indexing holes 82. Windows 108, 110 remain in the illustrated configuration as bracket 102 moves to the second set of indexing holes 82. When bracket 102 moves to the third and fourth sets of indexing holes 82, windows 108, 110 are removed, rotated 180 degrees such that the unexposed surfaces are externally-exposed and slits 112, 114 are on the left and reinserted into respective U-shaped apertures 104, 106. Window 108 is then secured to housing portion 102b using screw 116 and indentation 117. Window 110 is then secured to housing portion 102b using flat securing portion with screws 118 engaged in tilted portions 102a.

To remove and/or rotate mirror 74, bracket 102 is removed from mounting base 72 by unscrewing indexing screws 78 from indexing holes 82. Then, bracket 102 is re-attached to mounting base 72 in a desired index position 90.

The disclosed invention greatly enhances the ability of a laser micro-machining system to deal with scenarios in which the system angle of attack needs to be modified to accommodate the needs for a particular work piece geometry and can extend mirror life by reducing contamination using only portions of the mirror during processing. For example, about 500 parts can be run at each indexing position 90 of the indexible mirror 74, even in the absence of the benefits provided by the additional enclosed bracket 102. Such systems can be quickly re-configured to deal with a variety of scenarios at little additional cost and/or time or can modify its angle of attack or index its mirror "on-the-fly" during part processing, further enhancing the ease-of-use for such a system.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. In a laser micro-machining system including a laser source positioned to direct a laser pulse through a scan lens to a work piece mounted on a work surface, the improvement comprising:
    a mirror positioned between the scan lens and the work piece and tilted with respect to the work surface to reflect the laser pulse toward the work piece such that the laser pulse impacts the mirror at a 90 degree angle with respect to the work surface and reflects toward the work piece at an angle of attack of other than 90 degrees with respect to the work surface.

2. The laser micro-machining system according to claim 1 wherein the mirror is mounted to one of a part carrier defining the work surface and a scan lens assembly supporting the laser source and the scan lens.

3. The laser micro-machining system according to claim 2 wherein the mirror is tilted at a 45 degree angle.

4. The laser micro-machining system according to claim 2 wherein the improvement further comprises:
    means for rotating the mirror relative to the work piece and about at least one axis.

5. The laser micro-machining system according to claim 2 wherein the improvement further comprises:
    means for moving the mirror relative to the work piece and along at least one axis.

6. The laser micro-machining system according to claim 2 wherein the mirror is mounted with respect to the scan lens in such a way that a scan lens output beam has a vertical path to the work surface in addition to an angled path provided by the mirror.

7. The laser micro-machining system according to claim 6, further comprising:
    a second mirror mounted to a part carrier defining the work surface, the second mirror mounted to receive the scan lens output beam from the vertical path and the second mirror mounted at an angle with respect to the work surface.

8. The laser micro-machining system according to claim 1 wherein the improvement further comprises:
    a mount including a first portion and a second portion, the first portion having a facing surface tilted with respect to the work surface and the second portion including an aperture surrounding at least three sides of the mirror, the mirror located between the facing surface of the first portion and the second portion.

9. The laser micro-machining system according to claim 8 wherein the improvement further comprises:
    a plurality of indexing holes in the facing surface of the first portion; and
    at least one indexing screw passing through the second portion and engaging a respective indexing hole of the first portion.

10. The laser micro-machining system according to claim 9 wherein the second portion is slidingly engaged with the first portion to move the mirror to a plurality of indexing positions corresponding the respective indexing holes in which the at least one indexing screw is engaged, each of the indexing positions representing a contact area for the laser pulse.

11. The laser micro-machining system according to claim 8 wherein the mirror includes a first surface facing the facing surface of the first portion and a second surface facing external to the aperture and wherein the second portion includes a tilted portion including the aperture and a housing portion surrounding at least a portion of the aperture, the housing portion including a first slit configured to receive the laser pulse from the laser source at the second surface and a second slit configured to allow the laser pulse deflected by the second surface of the mirror to exit the housing portion in a direction of the work piece.

12. The laser micro-machining system according to claim 11 wherein the improvement further comprises:
    a first air inlet inserted into the second portion;
    at least one air slot between the second portion and the second surface of the mirror at a top portion of the mirror, the first air inlet connected to the at least one air slot to provide air to the at least one air slot; and
    a second air inlet inserted into the housing portion of the second portion and configured to provide air to the housing portion.

13. The laser micro-machining system according to claim 10 wherein the housing portion includes an opening at a lower end of the second portion configured to allow debris to pass from the second surface of the mirror to external of the housing portion.

14. The laser micro-machining system according to claim 13 wherein the improvement further comprises:
    a plurality of indexing holes in the facing surface of the first portion; and
    at least one indexing screw passing through the second portion and engaging a respective indexing hole of the first portion, the second portion engageable with the first portion to move the mirror to a plurality of indexing positions corresponding the respective indexing holes in which the at least one indexing screw is engaged, each of the indexing positions representing a contact area for the laser pulse.

15. The laser micro-machining system according to claim 11 wherein the improvement further comprises:
    a first U-shaped opening in a side of the housing portion facing the scan lens;
    a second U-shaped opening in a side of the housing portion facing the direction of the workpiece;
    a first removable piece slidingly engaged with the first U-shaped opening and including the first slit; and
    a second removable piece slidingly engaged with the second U-shaped opening and including the second slit.

16. The laser micro-machining system according to claim 11 wherein the improvement further comprises:
    a plurality of indexing holes in the facing surface of the first portion; and
    at least one indexing screw passing through the second portion and engaging a respective indexing hole of the first portion, the second portion engageable with the first portion to move the mirror to a plurality of indexing positions corresponding the respective indexing holes in which the at least one indexing screw is engaged, each of the indexing positions representing a contact area for the laser pulse.

17. The laser micro-machining system according to claim 8 wherein the first portion is fixedly mounted with respect to the work piece and the second portion is movable with respect to the first portion.

18. The laser micro-machining system according to claim 8 wherein the first portion is movably mounted with respect to the work piece.

19. In a laser micro-machining system including a laser source positioned to direct a laser pulse through a scan lens to a work piece mounted on a work surface, the improvement comprising:
   a mirror positioned between the scan lens and the work piece and tilted with respect to the work surface to reflect the laser pulse toward the work piece; and
   a mount including a first portion and a second portion, the first portion having a facing surface tilted with respect to the work surface and the second portion including an aperture surrounding at least three sides of the mirror, the mirror located between the facing surface of the first portion and the second portion.

20. The laser micro-machining system according to claim 19 wherein the mirror includes a first surface facing the facing surface of the first portion and a second surface facing external to the aperture, the improvement further comprising:
   an air inlet inserted into the second portion; and
   at least one air slot between the second portion and the second surface of the mirror at a top portion of the mirror, the air inlet connected to the at least one air slot to provide air to the at least one air slot.

21. The laser micro-machining system according to claim 20 wherein the at least one air slot comprises two air slots separated by an extension projecting from the second portion into the aperture of the second portion.

* * * * *